United States Patent [19]
Cao et al.

[11] Patent Number: 5,534,812
[45] Date of Patent: Jul. 9, 1996

[54] COMMUNICATION BETWEEN CHIPS HAVING DIFFERENT VOLTAGE LEVELS

[75] Inventors: Tai A. Cao; Satyajit Dutta; Thai Q. Nguyen; Thanh D. Trinh; Lloyd A. Walls, all of Austin, Tex.

[73] Assignee: International Business Machines Corporation, Armonk, N.Y.

[21] Appl. No.: 426,753

[22] Filed: Apr. 21, 1995

[51] Int. Cl.$^6$ .................................................. H03L 5/00
[52] U.S. Cl. .......................... 327/333; 326/30; 326/62; 326/80
[58] Field of Search .................... 327/333, 108, 327/534; 326/30, 80, 81, 62, 63, 68; 333/32, 33

[56] References Cited

U.S. PATENT DOCUMENTS

| | | | |
|---|---|---|---|
| 3,283,180 | 11/1966 | Pressman | 326/124 |
| 3,383,526 | 5/1968 | Berding | 326/90 |
| 3,660,675 | 5/1972 | Andrews, Jr. | 326/30 |
| 3,959,665 | 5/1976 | Gilbreath et al. | 326/80 |
| 4,339,673 | 7/1982 | Perry | 326/16 |
| 4,345,171 | 8/1982 | Harris, Jr. | 326/30 |
| 4,427,904 | 1/1984 | Imazeki et al. | 326/80 |
| 4,888,501 | 12/1989 | Sanwo et al. | 327/333 |
| 5,084,637 | 1/1992 | Gregor | 326/81 |
| 5,095,231 | 3/1992 | Sartori et al | 326/30 |
| 5,223,751 | 6/1993 | Simmons et al. | 326/81 |
| 5,418,475 | 5/1995 | Otaka | 326/30 |
| 5,436,585 | 7/1995 | DiMarco | 327/333 |

*Primary Examiner*—Timothy P. Callahan
*Assistant Examiner*—My-Trang Nu Ton
*Attorney, Agent, or Firm*—Mark E. McBurney

[57] ABSTRACT

The present invention includes an output circuit for a driver on a first chip that will cause an unterminated transmission line to create a predetermined voltage reflection. This reflection will then be added to the output of the driver circuit to obtain a voltage level capable of switching the receiver circuit, located on a second chip. Further, the impedance of the driver can be varied to adjust the voltage level of the signal being transmitted to the receiver, in order to reduce noise margins and cause the receiver to switch more quickly. Additionally, the transmission line impedance can also be modified to create overshoot, thereby allowing chips with dissimilar voltage levels to communicate with one another.

13 Claims, 3 Drawing Sheets

COMMUNICATION BETWEEN CHIPS HAVING DIFFERENT VOLTAGE LEVELS

BACKGROUND OF THE INVENTION

The present invention generally relates to the communication of electrical signals between different integrated circuit (IC) devices, or chips, in a data processing system. More specifically, the present invention provides a novel method of transmitting compatible electrical signals between chips which operate at different voltage levels by varying the impedance of a driver circuit with respect to an unterminated transmission line.

Complementary metal oxide semiconductor (CMOS) technology is advancing making circuitry smaller and reducing the power supply voltages needed for their operation. However, there are many chips in a computer system that may not use the newest CMOS technology. Therefore, it is necessary for a newer chip using, e.g. a 2.5 volt power supply to communicate with an older chip using, e.g. a 3.3 volt power supply. Typically, a single computer system may include multiple ones of these chips which operate at different voltage levels. The chips using newer technology generally operate at a lower voltage level than the older chips. In order to preserve compatibility, newer technology chips are often designed with multiple power supplies such that the voltage of the older chips can be matched. This is not an optimum solution since the newer ICs will have to include redundant power supplies which cause greater power consumption, use additional space on the chip and increase cost.

U.S. Pat. No. 3,959,665 shows a driving logic circuit with an interfacing means for making the driving logic compatible with a driven (receiver) circuit. This compatibility is provided by using a first DC power source and a second DC power source. U.S. Pat. No. 4,339,673 describes a driver circuit including a pair of variable reference voltages. More specifically two voltage sources $V_h$ and $V_l$.

In conventional CMOS systems transmission lines are source terminated in order to ensure that no reflection occurs which will cause the driver voltage to be increased by the amount of the reflected signal (overshoot).

It can be seen that a need exists for a system which allows interconnection of chips using various voltage levels in a computer system, without the necessity of including multiple power supplies on the most recently designed chips to accommodate the voltages on all of the other connected chips in the computer system. Further, it is a difficult task for chip designers to try and anticipate which other ICs may be connected to the chip being designed in order to determine which additional power supplies must be included.

SUMMARY OF THE INVENTION

In contrast to the prior art, the present invention provides an output circuit for a driver on a first chip that will cause an unterminated transmission line to create a predetermined voltage reflection. This reflection will then be added to the output of the driver circuit to obtain a voltage level capable of switching the receiver circuit, located on a second chip. Further, the impedance of the driver can be varied to adjust the voltage level of the signal being transmitted to the receiver, in order to reduce noise margins and cause the receiver to switch more quickly. Additionally, when chips having dissimilar voltage levels are placed on a substrate, the characteristic impedance of the transmission line can be varied to ensure efficient transmission of signals between the two chips.

Therefore, in accordance with the previous summary, objects, features and advantages of the present invention will become apparent to one skilled in the art from the subsequent description and the appended claims taken in conjunction with the accompanying drawing.

DETAILED DESCRIPTION OF THE PREFERRED EMBODIMENT

Figure 1:
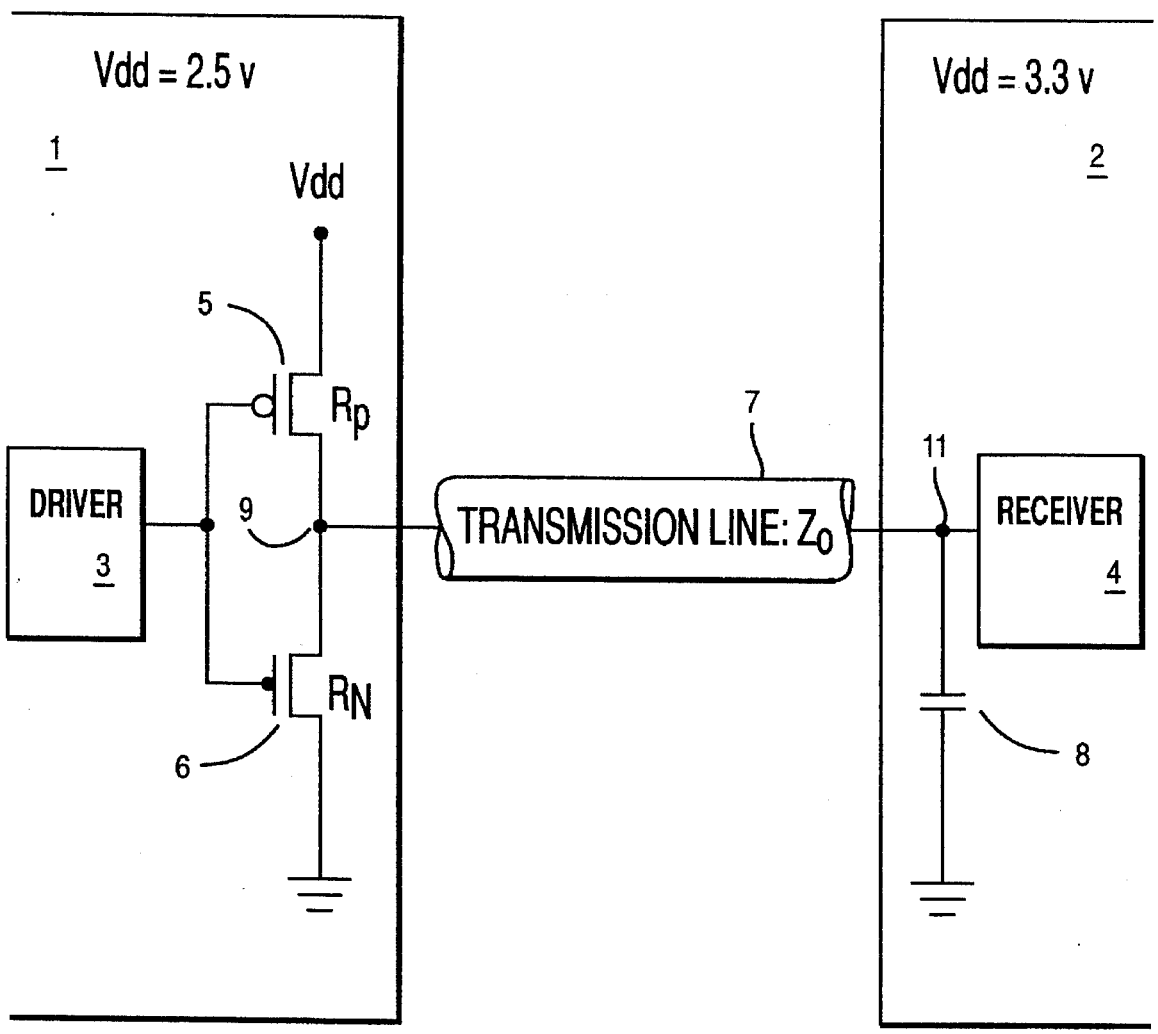
FIG. 1 is a circuit diagram illustrating a preferred embodiment of the present invention wherein the impedance of a driver circuit is varied to allow efficient transmission of signals between chips having using different voltages.

Referring to FIG. 1, a circuit diagram is shown wherein a first chip 1 is interconnected to second chip 2 by transmission line 7. Those skilled in the art will understand how chip 1 can be any one of a number of integrated circuit devices, such as a central processing unit (CPU) or application specific integrated circuits (ASIC). The present invention is capable of being used on any chip that includes an off-chip driver (OCD) to communicate with a receiver on another chip. Similarly, chip 2 can be any one of a number of chips, such as a CPU or ASIC that includes a receiver for capturing a signal from another chip. In one preferred embodiment chips 1 and 2 may be placed on a multichip module (MCM) and connected to one another by a transmission line that is present in the module substrate.

The operation of the present invention will now be described with reference to FIG. 1. Chip 1 includes driver 3 which is any one of a number of standard drivers commonly used in integrated circuit technology, such as an amplifier circuit which provides an amplified voltage signal (logical 1) or zero voltage (logical 0). The present invention is in output stage of the driver in the form of a push-pull transistor circuit. This circuit includes a P-type transistor 5 and an N-type transistor 6. Those skilled in the art will understand that a P-type device is turned on, i.e. it will conduct electricity when a logical 0 is applied to its gate. An N-type transistor will conduct electricity when a logical 1 is applied to its gate. Each of these devices will present an equivalent resistance (Rp and Rn) when it is turned on.

Transistor 5 is connected to Vdd, which is the power supply voltage for chip 1. It can be seen that in a preferred embodiment Vdd for chip 1 is 2.5 volts and Vdd for chip 2 is 3.3 volts. These voltages are representative of levels used by current technology ICs. That is, chip 1 with 2.5 volt Vdd is a newer design, and chip 2 with 3.3 volts for Vdd is an older design. However, there are numerous applications where a system will use existing ASICs (e.g. a memory chip) in conjunction with a newly designed microprocessor. Although FIG. 1 illustrates one example wherein chips using different voltages are connected, it should be understood that all instances where a chip with a first voltage level is to transmit information to a chip having a second, different voltage.

Transmission line 7 connects the output of transistors 5 and 6 to receiver 4, which is present on chip 2. Receiver 4 is any one of a common type of receiver circuit that is well known in the art. A capacitor 8 represents the input load of a receiver. The input impedance of the receiver acts as a capacitor such that the transmission line is unterminated. Transmission line 7 is of a characteristic impedance Zo which is a function of the physical characteristics of the metallurgy used to form the line, the dimensions of the line and the process utilized to create the transmission line. Transistors 5 and 6 can be sized to vary the resistances Rp and Rn.

In a first example, transmission line 7 is unterminated and its characteristic impedance Zo is equal to 50 ohms. In this case it is assumed that the driver impedance matches the transmission line impedance. That is, Rp=Rn=50 ohms. When driver 3 outputs a logical 0 to both transistors 5 and 6, then P-type transistor 5 is turned on and transistor 6 remains off. In this case, the voltage Vdd sees two 50 ohm resistances connected as a voltage divider, i.e. Vdd×Rp/(Rp+Zo) or 2.5×50/(50+50)=1.25 volts. Therefore, the voltage signal provided to transmission line 7 is 1.25 volts. Since, the transmission line is unterminated (or open), the coefficient of reflection is 1.0 which will cause a reflected voltage equal to the initial voltage of 1.25 volts. That is, 1.25 volts will be added to the initial voltage of 1.25 volts, thereby giving a total voltage of 2.5 volts at the input of receiver 4 (node 11).

The standard industry specification for receivers having a Vdd=3.3 volts requires at least 2.0 volts to switch these devices. Thus, a voltage level of 2.5 volts is within these specifications and will cause receiver 4 to switch. It should be noted that the reflected voltage which is present at node 9 will not be reflected back again towards the receiver 4, since we are assuming a matched condition. That is, the relation between the reflected voltage and the initial voltage will be zero. More specifically, the coefficient of reflection equals:

$$V_{reflected}/V_{initial}=(Rp-Zo)/(Rp+Zo),$$

or $$(50-50)/100=0.$$

Thus, the reflected voltage is absorbed by the driver on chip 1.

In the case where a logical 1 is supplied by driver 3, transistor 6 is turned on and pulls the node 9 down to ground potential (reference) such that the resistance in transistor 6 will match the transmission line impedance, Zo. This will cause the transmission line to be properly source terminated the signal at the receiver 4 will not fall below ground (undershoot). It can be seen that the resistance of transistor 6 will affect the waveform when it is transitioning in a negative direction.

Thus, in the case of a driver on chip 1 that is matched to the impedance of the transmission line, the signal from driver 3 (using Vdd=2.5 v) will switch a receiver 4 (using Vdd=3.3 v) on chip 2.

However, it is not always possible, or even desirable to have an impedance matching situation. Even though the 2.5 volt signal provided from a matched driver will switch receiver 3, it would be more efficient if the voltage signal from the driver on chip 1 would approach (or even equal) the Vdd for the receiver on chip 2. By providing a signal that is closer to the Vdd level of the circuit being switched, noise margins are increased and the receiver circuit will switch faster, thereby improving overall system performance.

In another preferred embodiment, the present invention presents an unmatched impedance to the transmission line which allows the voltage signal to be substantially equal to the Vdd of the circuit being switched.

Returning to FIG. 1, another example will be described wherein the end result is a voltage of 3.3 volts at node 11 of chip 2. Since, transmission line 7 is not terminated (open), then a coefficient of reflection of 1.0 will still be present, thereby doubling the voltage output by driver 3 on node 9. Therefore, the voltage necessary to be output by driver 3 at node 9 is equal to 3.3 v×0.5=1.65 volts. Assuming that the impedance of transmission line 7 remains constant at 50 ohms, then the resistance Rp of transistor 5 can be varied to give an output of 1.65 volts. The voltage divider, Zo/(Zo+Rp)×2.5 volts (Vdd of chip 1) can be used. Since it is known that 1.65 volts is needed at node 9, this voltage can be set equal to the voltage divider and the equation solved for Rp. That is, $$1.65=Zo/(Zo+Rp)\times 2.5 \text{ volts},$$

and $$Rp=0.515\times Zo.$$

In the case where Zo=50 ohms, then Rp=25.75 ohms. Thus, when driver 3 outputs a logical 0 and transistor 5 is turned on a signal of 1.65 volts is present at node 9 and provided to transmission line 7. Since line 7 is unterminated, the coefficient of reflection is one (1) and a signal of 1.65 volts will be reflected from node 11 back to node 9. These two voltages are added giving 3.3 volts which will efficiently switch the receiver 4 of chip 2. Thus, is can be seen how selecting a P-type transistor 5 with a predetermined resistance Rp will cause the desired voltage to be present at receiver 4 in order to ensure that fast switching with good noise immunity will occur. In other words, the output voltage of driver 3 can be adjusted to match the voltage that receiver 4 is expecting to receive by varying the resistance Rp. In this case, the voltage reflection (which is considered detrimental by prior art devices) is used to provide signal compatibility between at least two chips having dissimilar voltage levels, without the need of providing additional power supplies.

However, in this preferred embodiment the driver circuit on chip 1 is mismatched with respect to transmission line 7. Thus, the reflected signal ($V_{reflected}$) will not be absorbed and another reflection will occur from driver 3 towards receiver 4. In this case, the original $V_{reflected}$ will become the new $V_{initial}$. Using the previously discussed equation where the coefficient of reflection equals:

$$V_{reflected}/V_{initial}=(Rp-Zo)/(Rp+Zo),$$

or $$(25.75-50)/(25.75+50)=-0.32\ (-32\%).$$

This gives approximately a −0.5 voltage reflection which is then transmitted along line 7 to node 11. Since the transmission line is unterminated its magnitude will be doubled (coefficient of reflection is 1.0) at node 11 yielding −1.0 volts which must be subtracted from the 3.3 volts currently present at node 11. Thus, 3.3 volts −1.0 volts equals 2.3 volts which will then be present at node 11. For this preferred embodiment, the receiver circuit 4 switches at 2.0 volts, therefore, the reflected transient voltage from driver 3 will not cause the receiver 4 to false switch. Further, those skilled in the art will understand that the first reflection from driver 3 to receiver 4 will have the greatest magnitude. Thus, any subsequent reflected voltages will also not cause receiver 4 to false switch.

Figure 2:
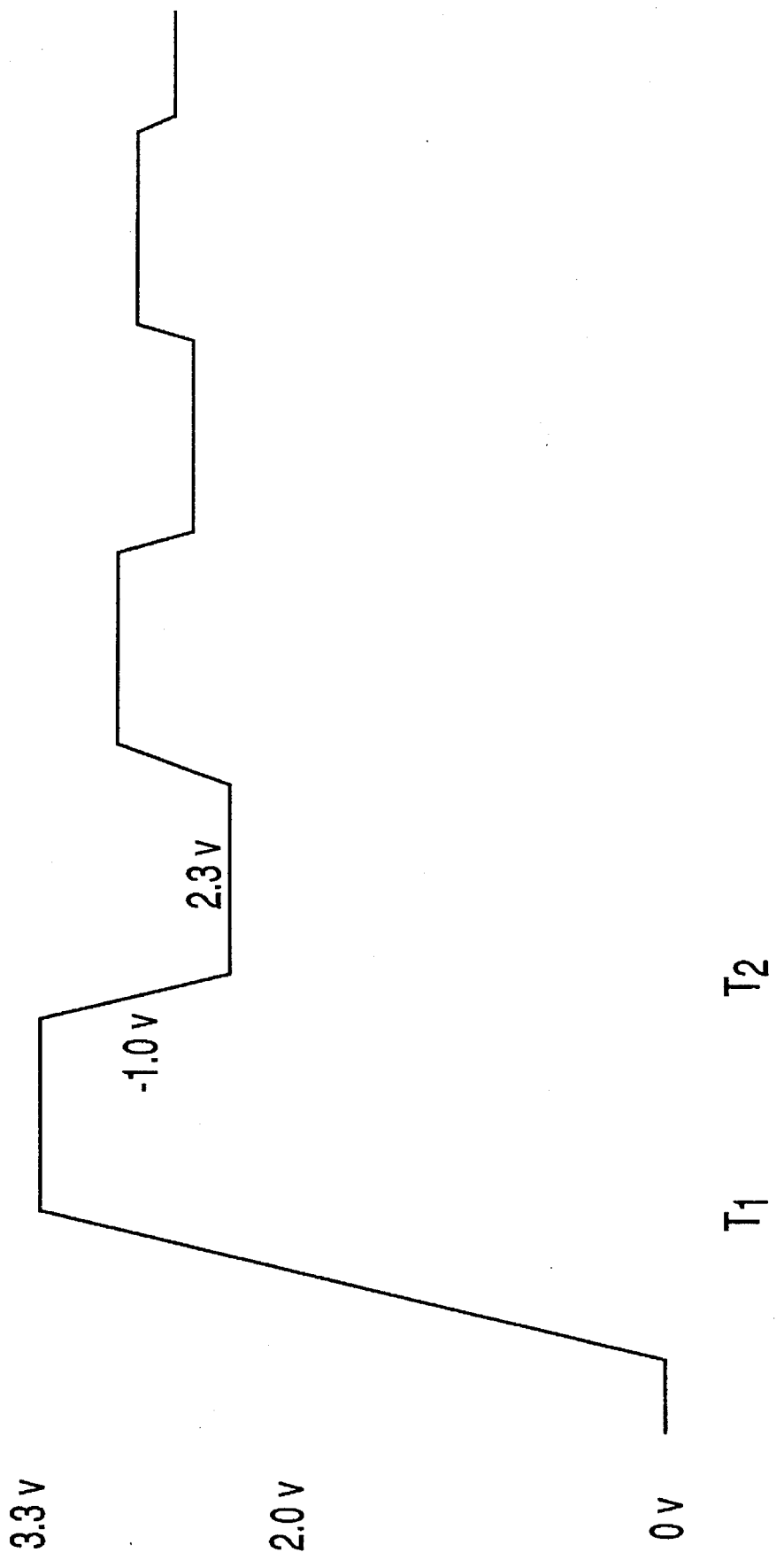
FIG. 2 is a timing diagram showing a waveform transmitted by a transmission line that interconnects two chips having power supplies that provide different voltages.

FIG. 2 illustrates the situation just described wherein 3.3 volts are present on node 11 at time T1. A negative 1.0 volts is then added to the 3.3 volts at time T2, resulting in the 2.3 volts that are then present at node 11. It can be seen from FIG. 2, that the voltage level never drops below the 2.0 volts necessary to falsely switch receiving circuit 4.

In the mismatched example, Rn remains at 50 ohms in order to avoid undershoot. When, a logical 1 is supplied by driver 3, transistor 6 is turned on and pulls the node 9 down to ground potential (reference) such that the resistance in transistor 6 will match the transmission line impedance, Zo (i.e. 50 ohms). This will cause the transmission line to be properly source terminated and the signal at the receiver 4 will not fall below ground (undershoot). It can be seen that the resistance of transistor 6 will affect the waveform when it is transitioning in a negative direction.

Another preferred embodiment will now be described wherein the impedance of the driver circuit remains constant and the transmission line impedance Zo is varied to allow chips having different voltage levels to communicate with one another. This embodiment also has particularly utility in the case where a first chip, including a driver circuit and using a power supply of 2.5 volts (for example), is connected to second chip having a receiver, which uses a voltage of e.g. 3.3 volts. As noted above, the chips utilizing newer technology typically operate at a lower voltage. However, it is often the case wherein newer technology chips may need to be used in the same system with older technology chips. Once the chips are designed and fabricated it is impractical to modify their circuits to adjust the impedance of the drivers and receivers contained thereon. It is very common to include chips on a substrate that has several wiring layers and input/output points in order to build the modules (multichip modules, or MCM and single chip modules, or SCM) that make up the computer system. These modules will include the transmission line(s) that connect the chips attached thereto. Even though it may be impractical to modify driver and receiver circuits on existing chips, it is a relatively easy task to form the transmission lines on the substrates by etching, plating, sputtering, or the like. Further, discrete electronic circuit elements, such as resistors, capacitors and inductors can be added to the substrate with relative ease.

Figure 3:
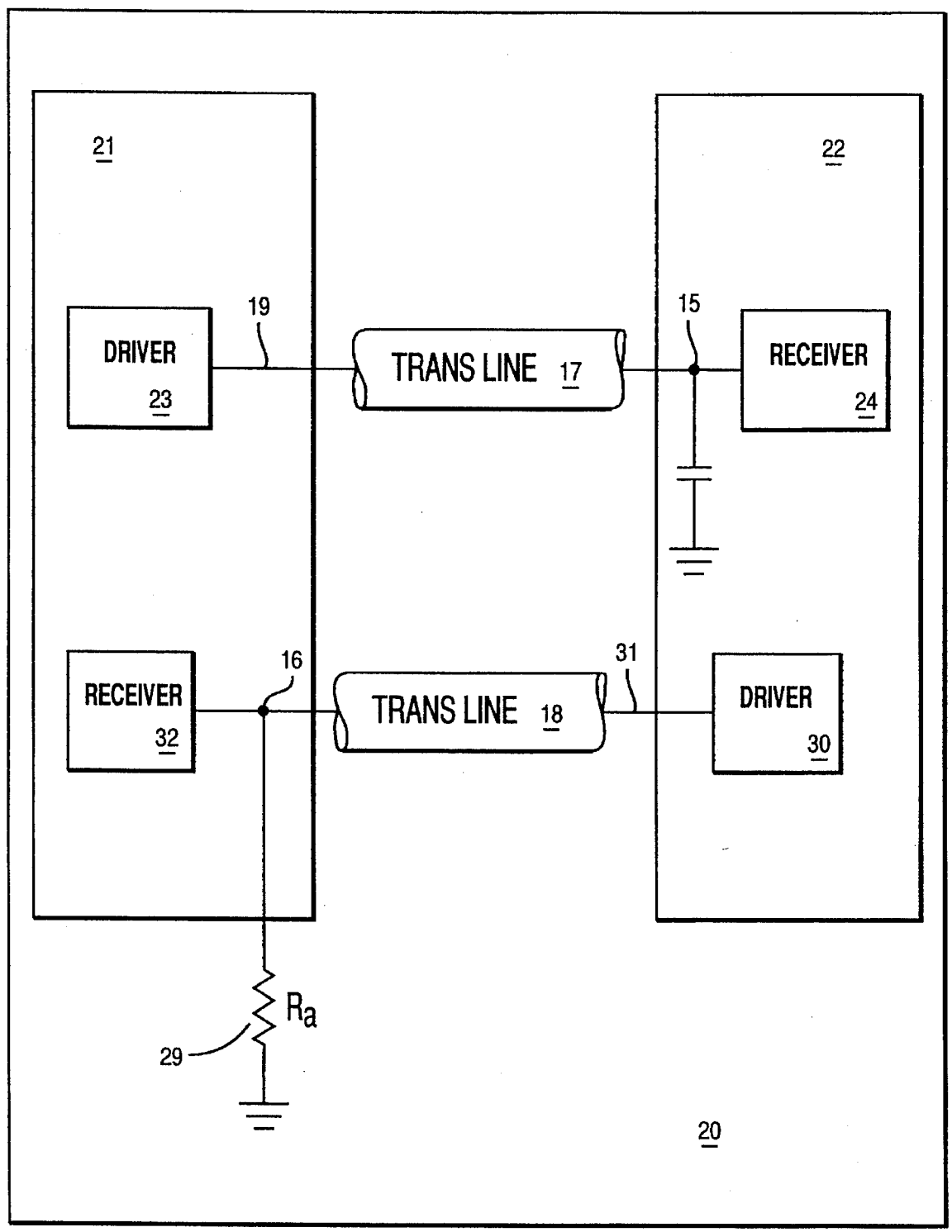
FIG. 3 is another circuit diagram of another preferred embodiment of the present invention illustrating how the characteristic impedance of the transmission line can be varied to provide communication between chips having different voltages.

FIG. 3 shows a single chip module wherein a first chip 21 and second chip 22 are mounted on a substrate 20 to form a multichip module. The chips are mounted on substrate 20 using any one of the well known interconnect technologies such as controlled collapse chip connect (C4), solder ball connect (SBC), wire bonding, or the like. Chip 21 includes a driver 23, which may be one of the well known driver circuits which outputs a logical 0 or a logical 1 on I/O line 19. Transmission line 17 is integral to MCM 20 and connects to line 19. Transmission line 17 will have a characteristic impedance Zo, which is a function of the physical parameters of the substrate and conductive material, line metallurgy and the like. Transmission line 17 is input via node 15 to an I/O point for receiver 24 on chip 22.

In one example, chip 21 utilizes a power supply voltage (Vdd) of 2.5 volts and chip 22 uses a voltage of 3.3 volts. As discussed above, it is possible to allow communication between these two chips by varying the impedance of the driver circuit. However, a problem exists in many cases where it is not feasible (or is impossible) to modify a complete chip. Another preferred embodiment of the present invention allows many types of chips with different voltages to communicate with one another by varying the characteristic impedance of the transmission line itself.

For example, the voltage at node 19 will be equal to:

$$Vdd \times Zo/(R_{driver}+Zo).$$

The resistance of the driver circuit will be known by examining the published specifications for chip 21. Since transmission line 17 is not terminated, it is known that a reflection, doubling the magnitude of the transmitted voltage signal, will be present at node 15. In this example, it is known that approximately 1.65 volts is needed at node 19 in order for 3.3 volts to be input to receiver 24. For this example it will be assumed that the resistance of driver 23 is 50 ohms. Setting the above relationship equal to 1.65 volts and solving for Zo will give the needed characteristic impedance of the transmission line. That is, 1.65=2.5×Zo/(50+Zo), and Zo=97 ohms. Typically, the physical characteristics of a substrate, and the fabrication technology will give a characteristic transmission line impedance of 50 ohms for line 17, when using an FR4 substrate. However, using it is possible to vary the impedance of transmission line 17 using substrate fabrication techniques. More particularly, chips 21 and 22 will likely be placed on a substrate 20 to form a multi-chip module. In order to connect the I/Os of the chips, transmission line 17 will have to be formed on substrate 20. In forming line 17, it is possible to vary the physical characteristics of the line in order to change the characteristic impedance. For example, the impedance will be less if the crossection of the conductive material is increased. Likewise, the impedance is greater if the crossection is decreased. Also, changing the distance between the transmission line conductor and the dielectric material on the substrate will alter the dielectric constant of the line, e.g moving the conductor away will increase capacitance, but lower impedance. Therefore, the present invention contemplates using techniques, such as described above, to vary the impedance of the transmission line 17 connecting chips 21 and 22. Thus, the impedance of the transmission line will need to have an impedance of 97 ohms (47 ohm increase over the typical transmission line characteristic impedance of 50 ohms) in order for a signal from driver 23 on chip 21 to switch receiver 24 on chip 22. That is, receiver 24 will have a 3.3 volt input signal from the 2.5 volt driver 23. The 3.3 volt input signal will cause receiver 24 to switch in an efficient manner with optimal noise margin and switching speeds.

More specifically, the transmission line impedance is varied (to 97 ohms in this case) and the driver and transmission line will be in an unmatched condition. Thus, a reflection will occur at driver 23. In this example, the reflection will be equal to:

$$V_{initial}/V_{reflected}=(R_{driver}-Zo)/(R_{driver}+Zo),$$

or $$(50-97)/(50+97)=-0.32(-32\%).$$

And, $-0.32 \times 1.65$ volts (reflected from node 15) gives $-0.5$ volts which is reflected back from driver 23 on line 19. When this $-0.5$ volts reaches node 15 it is doubled, due to the unterminated transmission line, and added to the existing 3.3 volt signal. This gives: 3.3 volts $-2 \times 0.5 = 2.3$ volts (undershoot, see FIG. 2). Industry standards specify that 3.3 volt receivers (e.g. receiver 23) will switch at a level of 2.0 volts which is less than the 2.3 volts present at node 15. Since the least positive voltage level that will switch the receiver is 2.0 volts, the 2.3 volt input signal will cause receiver 24 to switch in an acceptable manner with optimal noise margins and switching speed.

Therefore, receiver 24 will not falsely switch states due to the reflected voltage of $-0.5$ volts (because of the mismatched impedance between transmission line 17 and driver 23) on unterminated transmission line 17.

FIG. 3 also shows the case where a 3.3 volt driver 30 on chip 22 is connected to a 2.5 volt receiver 32 on chip 21. Another transmission line 18 connects driver 30 and receiver 32. Transmission line 18 is connected to driver 30 by line 31 and is connected to receiver 32 via a node 16. In this case, the output signal from driver 30 is 3.3 volts and the necessary input to receiver 32 is 2.5 volts. In this embodiment, the fabrication of substrate 20 can include a voltage divider circuit (not shown) including discrete resistors connected between the transmission line and driver 30. The voltage divider will add a resistance in parallel with the characteristic impedance of the transmission line in order to decrease the voltage drop of the 3.3 volt output signal from driver 30. The equivalent resistance of the voltage divider circuit should be approximately equal to the characteristic impedance of the transmission line (e.g. $+/-10\%$). This will create a matched condition at driver 30 such that the voltage signal wave reflected from the unterminated end of transmission line 18 at node 16 will be absorbed. Thus, the problems relating to overshoot and undershoot at driver 30 are minimized, or altogether eliminated.

In another embodiment, the characteristic impedance of transmission line 18 can be varied, as described above with regard to line 17, to decrease the voltage received at node 16 by receiver 32. In this case, receiver 32 at node 16 will be terminated. Otherwise a reflected voltage will be transmitted back along line 18 to driver 30 causing undesirable transient voltage levels on line 31. To terminate line 18, at node 16, a resistance Ra 29 is added which is connected between node 16 and ground. Resistor 29 will absorb, or dissipate, any reflected voltage, such that the coefficient of reflection at node 16 is equal to zero (0). Thus, it is desired that a voltage signal of 2.5 volts be transmitted along line 18 to receiver 32, via node 16. Since there is no reflection at node 16, the desired voltage must be transmitted by driver 30. To determine the characteristic impedance of transmission line 18 when 2.5 volts is needed at node 16 and 3.3 volts are input by driver 30 on line 31, the following equation is used.

$$2.5 = Zo/(Zo+Rp) \times 3.3 \text{ volts}$$

The resistance Rp will be a known value that is published in the specifications associated with chip 22. Typically, this value will be 50 ohms. Thus, to determine Zo for this example it will be assumed that Rp is equal to 50 ohms. Solving the previous equation for Zo gives a value of 156 ohms for the characteristic impedance of transmission line 18. Therefore, by using the techniques discussed above, the substrate 20 can be fabricated (e.g. making the conductive material have a smaller crossection) such that the characteristic impedance of line 18 is 156 ohms. This will cause a 2.5 volt signal to be received by receiver 32 when a 3.3 volt signal is output from driver 30.

In order for the voltage signal from driver 30 to be absorbed, the value of Ra 29 will need to substantially match the characteristic impedance (Zo) of transmission line 18. Thus, in the previous example, Ra 29 will be equal to 156 ohms. By varying the Zo of transmission line 17 and 18, and adding resistor 29, substrate 20 of the present invention will provide a system designer with the flexibility of using many different types of chips, having different voltage supplies. For example, a microprocessor using 1.8 volts, 2.5 volts, or the like can be used in conjunction with a storage control chip operating at 3.3 volts, or 5.0 volts. Those skilled in the art will understand that the voltages at line 31 and node 16 can be adjusted beyond the previous example by changing the characteristic impedance of transmission line 18 and resistance of resistor 29 to include other ranges of values.

Of course, there may be applications when a transmission line with a characteristic impedance of 156 ohms, or the like, is not practical, however, the present invention provides a solution allowing the use of chips with dissimilar voltages when a certain amount of system design flexibility is present.

Thus, it can be seen from the foregoing that the present invention allows many types of integrated circuit device having drivers and receivers for communicating with other drivers and receivers on other devices to communicate with one another, even if the chips use power supplies having different voltage levels.

While the invention has been shown and described with reference to particular embodiments thereof, it will be understood by those skilled in the art that the foregoing and other changes in form and detail may be made therein without departing from the spirit and scope of the invention.

We claim:

1. A system, comprising:
   a first circuit operating at a first voltage for transmitting control signals at said first voltage;
   a second circuit operating at a second voltage different from said first voltage for receiving control signals at said second voltage;
   a single transmission line, with a characteristic impedance different from an impedance of said second circuit, connecting said first and second circuits; and
   means, within said first circuit, for varying an output impedance of said first circuit, by turning on a transistor having a predetermined resistance, to transform the control signals output by said first circuit from said first voltage to said second voltage.

2. A system according to claim 1 wherein said transmission line causes a reflected voltage to be generated at an end connected to said second circuit.

3. A system according to claim 2 wherein said first voltage plus said reflected voltage equal said second voltage.

4. A system according to claim 3 wherein said means for varying is an inverter circuit, comprising:
   a P-type transistor connected to a voltage source and said transmission line; and
   an N-type transistor connected to ground and said transmission line.

5. A system according to claim 4 wherein an impedance of said P-type transistor is varied between an infinite resistance when said P-type transistor is turned off and said predetermined resistance when said P-type transistor is turned on to provide said first voltage on said transmission line.

6. A system according to claim 5 wherein the impedance of said P-type transistor causes said second voltage to remain in a range sufficient to operate said second circuit.

7. A system, comprising:
  a first circuit operating at a first voltage for transmitting control signals at said first voltage;
  a second circuit operating at a second voltage different from said first voltage for receiving control signals at said second voltage; and
  a single variable impedance transmission line, with a characteristic impedance different from an impedance of said second circuit, connecting said first and second circuits that transforms the control signals output by said first circuit from said first voltage to said second voltage;
  wherein said characteristic impedance is varied by altering physical characteristics of said transmission line or connecting at least one discrete electrical component thereto.

8. A system according to claim 7 wherein said transmission line causes a reflected voltage to be generated at an end connected to said second circuit.

9. A system according to claim 8 wherein said first voltage plus said reflected voltage equal said second voltage.

10. A system according to claim 9 wherein said circuit comprises driver circuit.

11. A system according to claim 10 wherein the impedance of said transmission line is varied to match an impedance of said driver circuit.

12. A circuit formed in a substrate, comprising:
  a first continuous transmission line connecting a first circuit operating at a first voltage for transmitting first control signals at said first voltage, and a second circuit operating at a second voltage different from said first voltage that receives said first control signals at said second voltage;
  a second continuous transmission line, having an impedance different from said first transmission line connecting a third circuit, for transmitting second control signals at said second voltage, and a fourth circuit for receiving said second control signals at said first voltage;
  means for varying an impedance of said first transmission line to transform said first control signal, transmitted from said first circuit at said first voltage, to said second voltage; and
  means for varying an impedance of said second transmission line to transform said second control signal, transmitted from said third circuit at said second voltage, to said first voltage;
  wherein said impedance of said first and second transmission lines is varied by altering physical characteristics of said first and second transmission lines or connecting at least one discrete electrical component thereto; and
  wherein said first circuit and said fourth circuit operating at said first voltage communicate with said second circuit and said third circuit operating at said second voltage.

13. A method for interconnecting a first circuit for transmitting control signals at a first voltage with a second circuit that receives control signals at a second voltage, comprising the steps of:
  operating said first circuit at said first voltage and said second circuit at said second voltage;
  connecting said first and second circuits with a single transmission line, having a characteristic impedance different from an impedance of said second circuit; and
  varying an output impedance of said first circuit, by turning on a transistor having a predetermined resistance, to transform the control signals output by said first circuit from said first voltage to said second voltage.

* * * * *